US006933195B2

(12) United States Patent
Lee

(10) Patent No.: US 6,933,195 B2
(45) Date of Patent: Aug. 23, 2005

(54) METHOD OF FABRICATING A FLASH MEMORY DEVICE

(75) Inventor: Woon-kyung Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/995,299

(22) Filed: Nov. 27, 2001

(65) Prior Publication Data

US 2002/0137270 A1 Sep. 26, 2002

(30) Foreign Application Priority Data

Mar. 20, 2001 (KR) ................................ 10-2001-0014322

(51) Int. Cl.[7] ............................................ H01L 21/336
(52) U.S. Cl. ....................................... 438/258; 257/390
(58) Field of Search ................................ 438/128–130, 438/201, 275, 261, 266, 257–258, 278–279, 593–594, 982, 262–267, 587, 591; 257/202, 390, 314–322, 412, 649, 324, 529

(56) References Cited

U.S. PATENT DOCUMENTS

| | | | | | |
|---|---|---|---|---|---|
| 4,163,985 | A | * | 8/1979 | Schuermeyer et al. | 257/324 |
| 4,697,330 | A | * | 10/1987 | Paterson et al. | 438/261 |
| 5,017,979 | A | * | 5/1991 | Fujii et al. | 257/319 |
| 5,188,976 | A | * | 2/1993 | Kume et al. | 438/258 |
| 5,200,636 | A | * | 4/1993 | Uemura et al. | 257/315 |
| 5,243,210 | A | * | 9/1993 | Naruke | 257/320 |
| 5,292,681 | A | * | 3/1994 | Lee et al. | 438/201 |
| 5,656,527 | A | | 8/1997 | Choi et al. | 438/258 |
| 5,792,696 | A | * | 8/1998 | Kim et al. | 438/258 |
| 5,943,262 | A | * | 8/1999 | Choi | 365/185.17 |
| 5,976,934 | A | * | 11/1999 | Hayakawa | 438/258 |
| 6,448,112 | B2 | * | 9/2002 | Lee | 438/128 |
| 2002/0008278 | A1 | * | 1/2002 | Mori | 257/315 |

* cited by examiner

*Primary Examiner*—David Vu
(74) *Attorney, Agent, or Firm*—Marger Johnson & McCollom, P.C.

(57) ABSTRACT

A method of fabricating a flash memory device includes forming a device isolation layer at a predetermined region of a semiconductor substrate having a cell array region and a peripheral circuit region. The device isolation layer defines a first active region and a second active region in the cell array region and the peripheral circuit region, respectively. A gate conductive layer is formed on the entire surface of the semiconductor substrate having the device isolation layer. The gate conductive layer is patterned to form a floating gate pattern covering the first active region. At this time, the peripheral circuit region is still covered with the gate conductive layer. An inter-gate dielectric layer and a control gate conductive layer are formed on the entire surface of the substrate including the floating gate pattern. The control gate conductive layer and the inter-gate dielectric layer, which are located in the peripheral circuit region, are selectively removed to expose the gate conductive layer in the peripheral circuit region.

12 Claims, 12 Drawing Sheets

METHOD OF FABRICATING A FLASH MEMORY DEVICE

This application relies for priority upon Korean Patent Application No. 2001-14322, filed on Mar. 20, 2001, the contents of which are herein incorporated by reference in their entirety.

FIELD OF THE INVENTION

The present invention generally relates to a method of fabricating a semiconductor device, and more particularly to a method of fabricating a flash memory device.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

These nonvolatile memory devices are classified into two groups. One is a NAND-type flash memory device and the other is a NOR-type flash memory device. Either of them adapts a cell transistor having a stacked gate. The stacked gate comprises a floating gate and a control gate electrode, which are sequentially stacked on a semiconductor substrate.

A tunnel oxide layer is interposed between the semiconductor substrate and the floating gate, and an inter-gate dielectric layer is interposed between the floating gate and the control gate electrode. Accordingly, the inter-gate dielectric layer as well as the tunnel oxide layer should be reliable in order to improve a data retention characteristic and the like.

FIG. 1 is a plan view for illustrating a typical flash memory device having a cell transistor and a peripheral transistor in a cell array region and in a peripheral circuit region, respectively.

Referring to FIG. 1, a plurality of first active regions 20 defined by an isolation layer (not shown) are disposed in a cell array region a of a semiconductor substrate. A plurality of parallel control gate electrodes 109 (or 309) cross over the first active regions 20. A floating gate F1 (F3' or F4') is interposed between the first active region 20 and the control gate electrode 109 (or 309). The floating gate F1 (F3' or F4') is extended to overlap with the edge of the isolation layer. A tunnel oxide layer (not shown) is interposed between the floating gate F1 (F3' or F4') and the first active region 20, and an inter-gate dielectric layer (not shown) is interposed between the floating gate F1 (F3' or F4') and the control gate electrode 109 (or 309). The inter-gate dielectric layer may be extended along the control gate electrode 109 (or 309).

Similarly, a second active region 30 defined by the isolation layer is disposed in a peripheral circuit region b of the semiconductor substrate. A gate electrode 110 (310 or 410) crosses over the second active region 30.

FIGS. 2A through 6A are cross sectional views for illustrating a conventional method of fabricating a flash memory device, taken along the line I–I ' of FIG. 1. Also, FIGS. 2B through 6B are cross sectional views for illustrating a conventional method of fabricating a flash memory device, taken along the line II–II' of FIG. 1.

Referring to FIGS. 2A and 2B, a device isolation layer 101 is formed at a predetermined region of a semiconductor substrate 100 to define first active regions (20 of FIG. 1) and a second active region (30 of FIG. 1) in a cell array region a and a peripheral circuit region b, respectively.

Referring to FIGS. 3A and 3B, a tunnel oxide layer 102 and a first conductive layer 103 are formed on the entire surface of the semiconductor substrate having the isolation layer 101. The first conductive layer 103 is patterned to form a floating gate pattern F1 covering the first active regions (20 of FIG. 1). At this time, the peripheral circuit region b is still covered with the first conductive layer 103.

An inter-gate dielectric layer 106 is then formed on the entire surface of the substrate including the floating gate pattern F1.

Referring to FIGS. 4A and 4B, the inter-gate layer 106, the first conductive layer 103 and the tunnel oxide layer 102 on the peripheral circuit region b are selectively removed, thereby exposing the isolation layer 101 and the second active region (30 of FIG. 1) in the peripheral circuit region b.

Referring to FIGS. 5A and 5B, a surface impurity diffusion layer (not shown) for adjusting a threshold voltage of a peripheral transistor is formed at the second active region of the peripheral circuit region b, and a gate oxide layer 105 is formed on the exposed second active region.

Afterwards a gate conductive layer 107 and a metal silicide layer 108 are sequentially formed on the entire surface of the substrate, whose portion b has the gate oxide layer 105.

Referring to FIGS. 6A and 6B, the metal silicide layer 108, the gate conductive layer 107, the inter-gate dielectric layer 106 and the floating gate pattern F1, which are located in the cell array region a, are sequentially patterned. As a result, a control gate electrode 109 crossing over the first active regions (20 of FIG. 1) is formed, and a floating gate F1' interposed between the control gate electrode 109 and the first active region (20 of FIG. 1) is formed.

Moreover, the metal silicide layer 108 and the gate conductive layer 107, which are located in the peripheral circuit region b, are successively patterned to form a gate electrode 110 crossing over the second active region (30 of FIG. 1). Impurity ions are implanted into the semiconductor substrate 100, thereby forming source/drain regions 113 and 114 in the cell array region a and the peripheral circuit region b. Interlayer insulating layer 111 is then formed on the entire surface of the substrate having the source/drain regions 113 and 114. The interlayer insulating layer 111 is patterned to form a contact hole 112 exposing the gate electrode 110.

Thus, the crucial inter-gate dielectric layer 106 of the conventional flash memory device is exposed from transitioning between FIGS. 4A, 4B to FIGS. 5A, 5B. In other words, the inter-gate dielectric layer 106 is exposed during a process of selective exposing of the second active region and the isolation layer in the peripheral circuit region b, a process of ion implantation, and a process of forming the gate oxide layer. The ion implantation process is necessary to adjust the threshold voltage of the peripheral transistor.

Since it is exposed, the crucial inter-gate dielectric layer 106 can be easily contaminated with heavy metal atoms in a photoresist layer, which is used in the patterning process. This contamination leads to a degradation of the inter-gate dielectric layer 106. In other words, the contamination makes the inter-gate dielectric layer 106 leaky. Accordingly, the reliability such as the data retention characteristic or the endurance characteristic to the erase/program cycles is deteriorated.

FIGS. 7A and 7B are schematic cross sectional views illustrating another conventional flash memory. The cell array region a has the same structure as that of the conventional flash memory device described in FIGS. 2A–6A and 2B–6B.

A difference, however, is that the peripheral circuit region b has a stacked gate pattern 210. The stacked gate pattern 210 comprises a gate electrode 103, an inter-gate dielectric layer 106, a gate conductive layer 107 and a metal silicide layer 108, which are sequentially stacked on the gate oxide layer 105. The gate conductive layer 107 and the metal silicide layer 108 constitute a dummy gate electrode. The dummy gate electrode and the gate electrode 103 are exposed by a butting contact 212 penetrating a portion of the interlayer insulating layer 111.

The butting contact technique requires a complex process. Thus, there continues to be a need for simple and reliable method of fabricating flash memory devices.

SUMMARY OF THE INVENTION

It is therefore an object of the present invention to provide a method of fabricating a flash memory device, which can improve the reliability of the inter-gate dielectric layer.

It is another object of this invention to provide a method of fabricating a flash memory device, which is capable of simplifying the process.

These and other objects, advantages and features of the present invention may be provided by a method of fabricating a flash memory device.

According to one aspect of the present invention, a method of fabricating a flash memory device includes forming a device isolation layer at a predetermined region of a semiconductor substrate having a cell array region and a peripheral circuit region, thereby defining first active regions in the cell array region and a second active region in the peripheral circuit region. A floating gate pattern covering the first active region and a gate conductive layer covering the peripheral circuit region are formed. An inter-gate dielectric layer and a control gate conductive layer are sequentially formed on the entire surface of the substrate having the floating gate pattern and the gate conductive layer. The control gate conductive layer and the inter-gate dielectric layer, which are located on the peripheral circuit region, are selectively etched, thereby exposing the gate conductive layer in the peripheral circuit region.

Additionally, the control gate conductive layer, the inter-gate dielectric layer and the floating gate pattern, that exist in the cell array region, are successively patterned, thereby forming control gate electrodes crossing over the first active regions and floating gate interposed between the word line pattern and the first active region. Also, the gate conductive layer in the peripheral circuit region is patterned to form a gate electrode crossing over the second active region.

The present invention's sequence of steps avoids the exposure of the inter-gate dielectric layer formed in the cell array region during the fabrication processes. Thus, it can prevent damage to the inter-gate dielectric layer by the related fabrication processes, such as the ion implantation process or the photolithography/etching process.

The invention therefore results in highly reliable flash memory devices. This and other features and advantages of the invention will become more readily apparent from the following Detailed Description, which proceeds with reference to the drawings, in which:

BRIEF DESCRIPTION OF THE DRAWINGS

The above and other objects and advantages of the present invention will become readily apparent from the description that follows, with reference to the accompanying drawings, in which:

FIGS. 2A through 6A are cross sectional views for illustrating a conventional method of fabricating a flash memory device, taken along the line I–I' of FIG. 1;

FIGS. 2B through 6B are cross sectional views for illustrating a conventional method of fabricating a flash memory device, taken along the line II–II' of FIG. 1;

FIGS. 8A through 11A are cross sectional views for illustrating a method of fabricating a flash memory device according to a preferred embodiment of the invention, taken along the line I–I' of FIG. 1;

FIGS. 8B through 11B are cross sectional views for illustrating a method of fabricating a flash memory device according to a preferred embodiment of the invention, taken along the line II–II' of FIG. 1.

DETAILED DESCRIPTION OF THE PREFERRED EMBODIMENT

Figure 1:
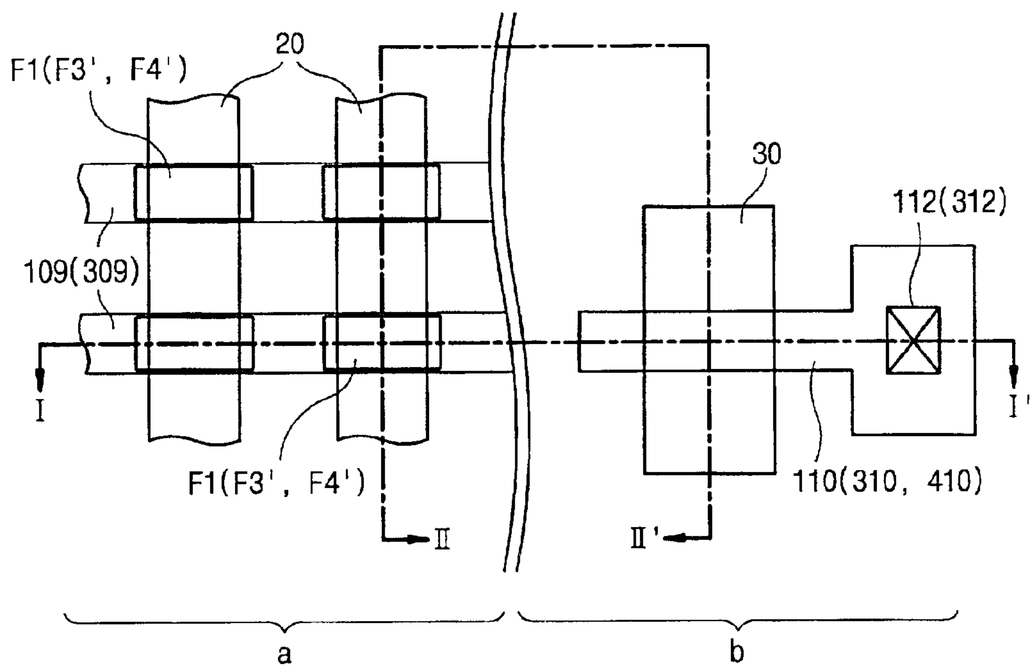
FIG. 1 is a plan view of a typical flash memory device.
Figure 2A:
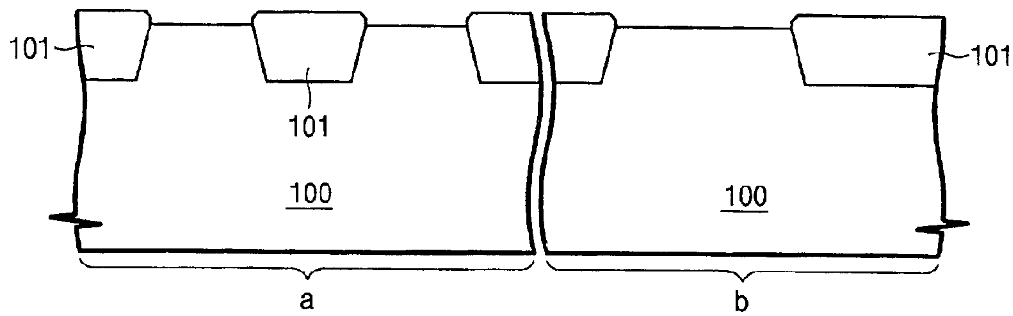
Figure 2B:
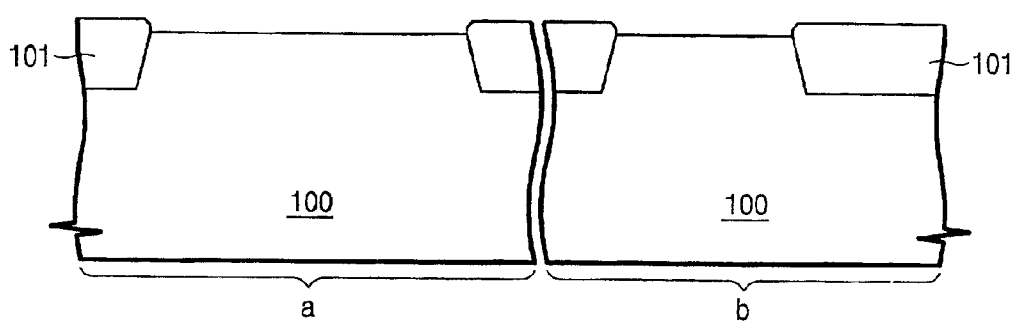
Figure 3A:
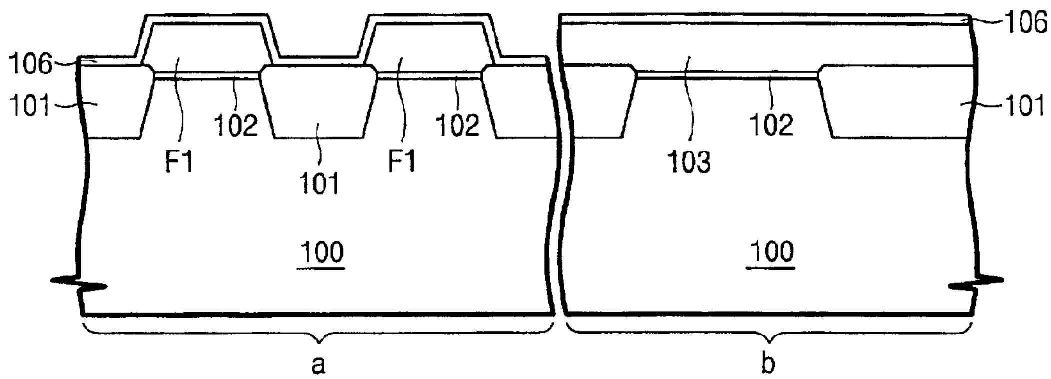
Figure 3B:
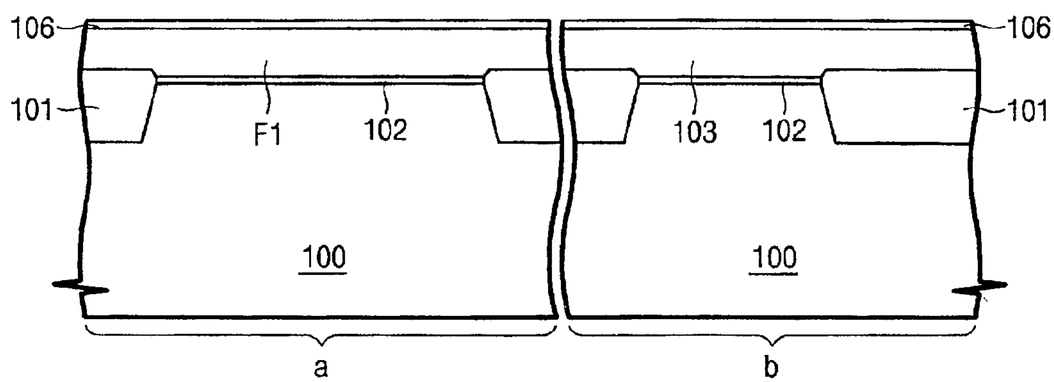
Figure 4A:
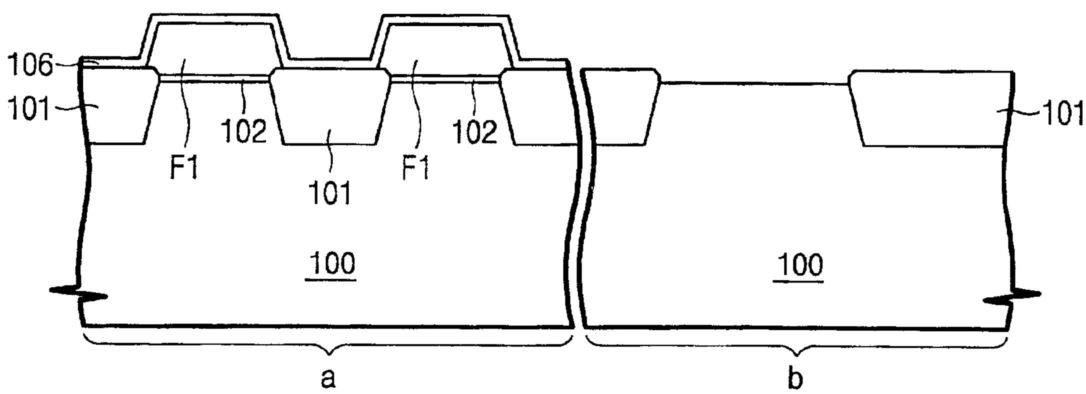
Figure 4B:
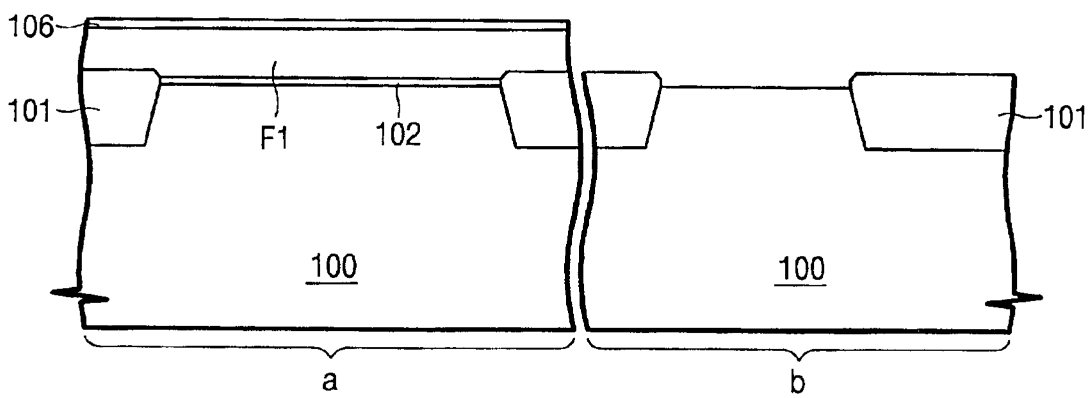
Figure 5A:
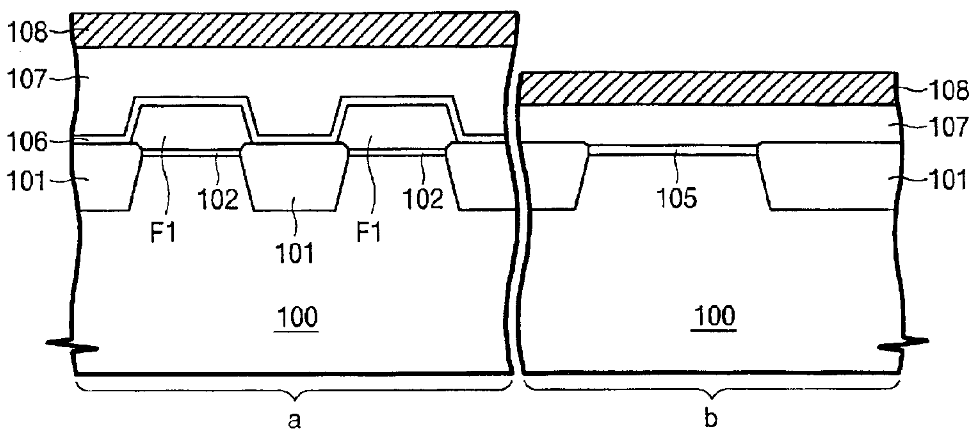
Figure 5B:
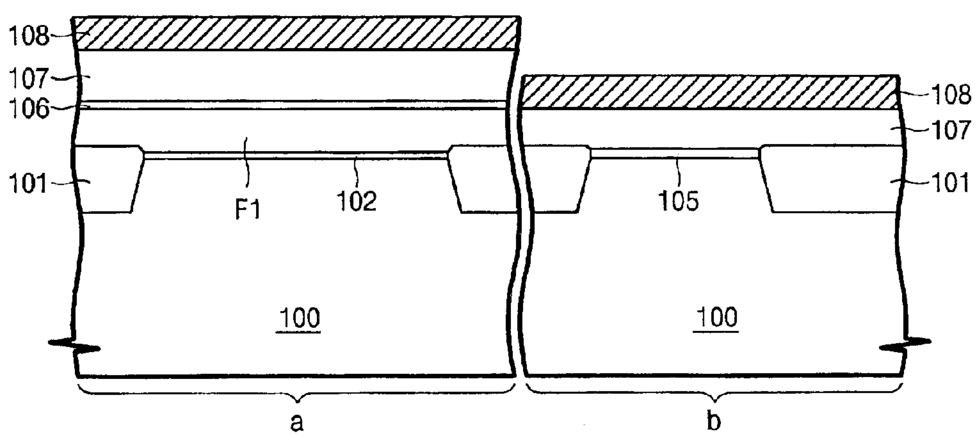
Figure 6A:
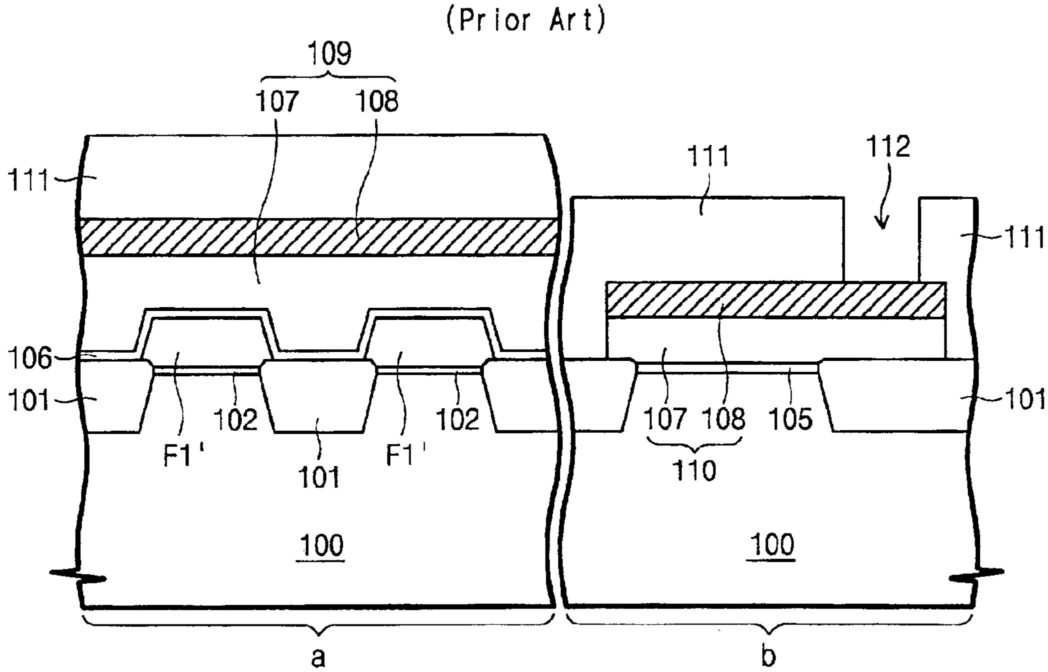
Figure 6B:
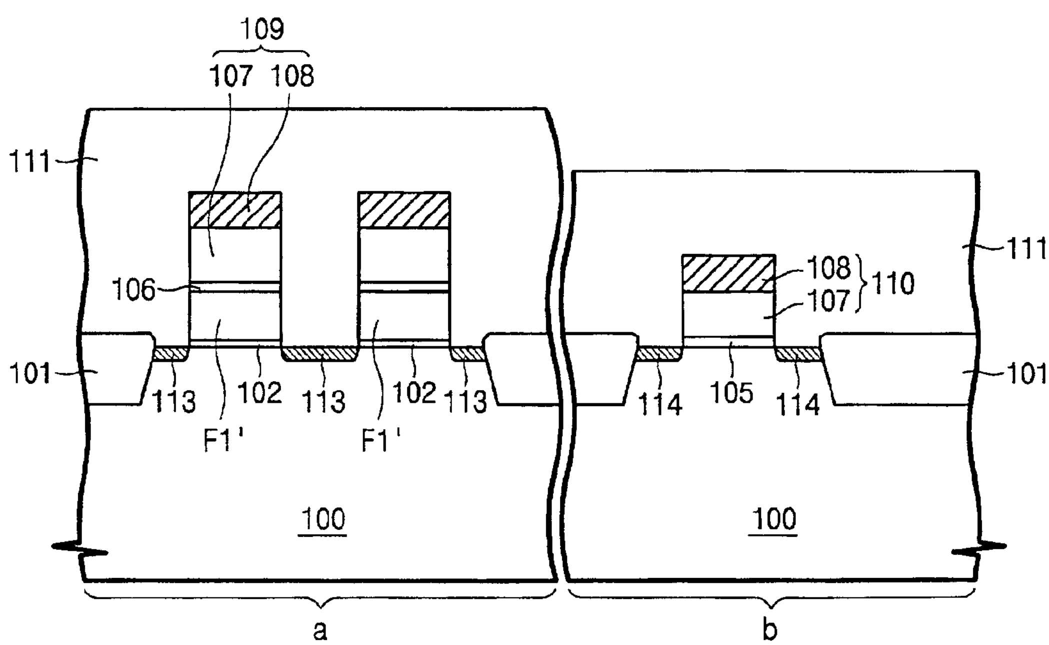
Figure 7A:
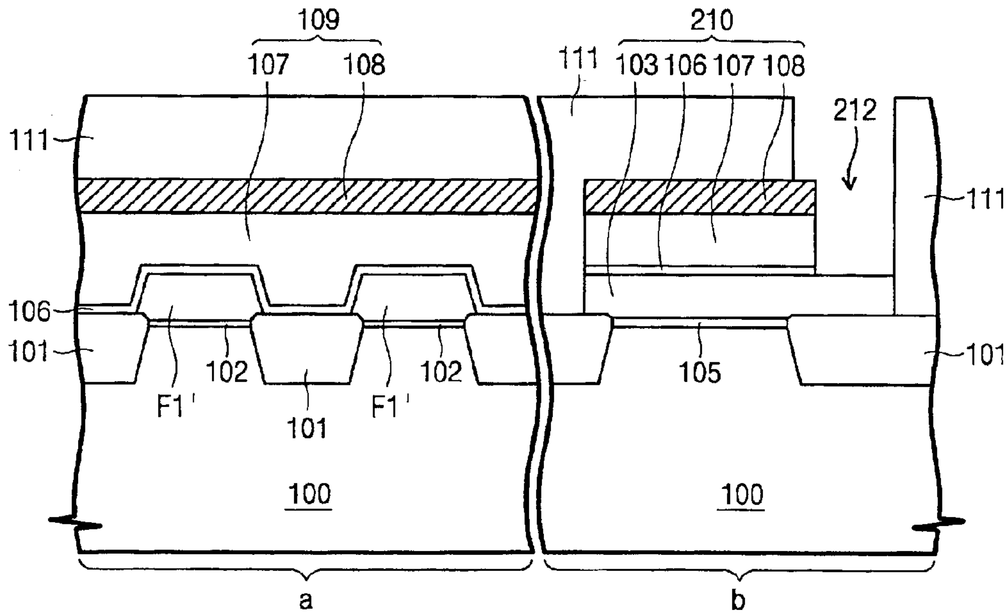
FIGS. 7A and 7B are cross sectional views for illustrating another conventional flash memory device, taken along the lines I–I' and II–II' of FIG. 1, respectively.
Figure 7B:
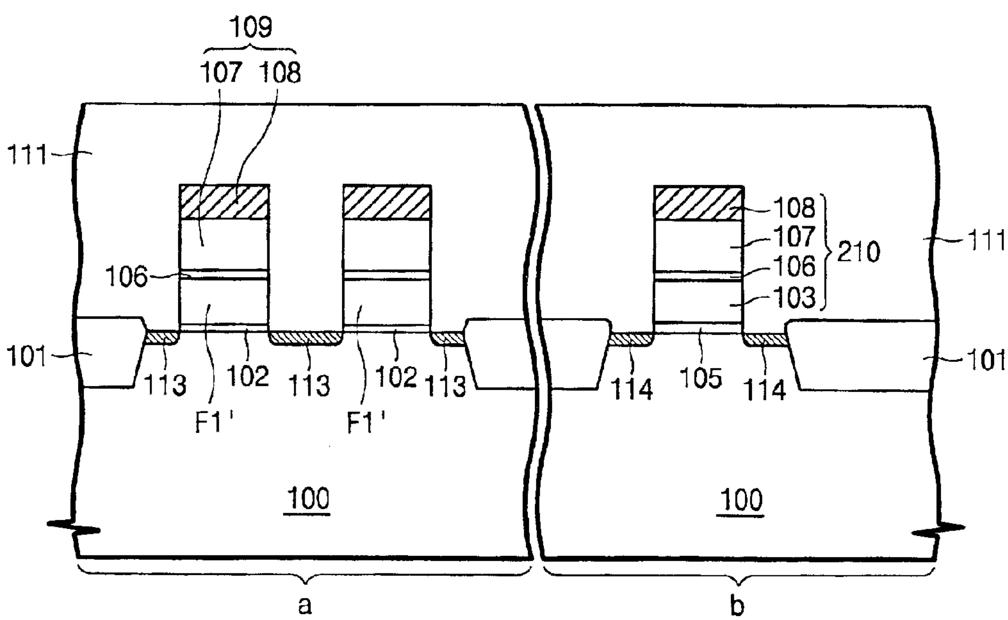

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art.

In the drawings, a portion indicated by a reference character "a" represents a cell array region and a portion indicated by a reference character "b" represents a peripheral circuit region. However, the portions "a" and "b" are not limited to the cell array region and the peripheral circuit region, respectively. The portions "a" and "b" may correspond to a highly integration density region and a relatively low integration density region, respectively. Like numbers refer to like elements throughout.

In the drawings, the thickness of layers and regions are exaggerated for clarity. It will also be understood that when a layer is referred to as being "on" another layer or substrate, it can be directly on the other layer or substrate or intervening layers may also be present.

FIGS. 8A through 11A are cross sectional views for illustrating a method of fabricating a flash memory device in accordance with one embodiment of the invention, taken along line I–I' of FIG. 1. FIGS. 8B through 11B are cross sectional views for illustrating a method of fabricating a flash memory device in accordance with one embodiment of the invention, taken along line II–II' of FIG. 1.

Figure 12A:
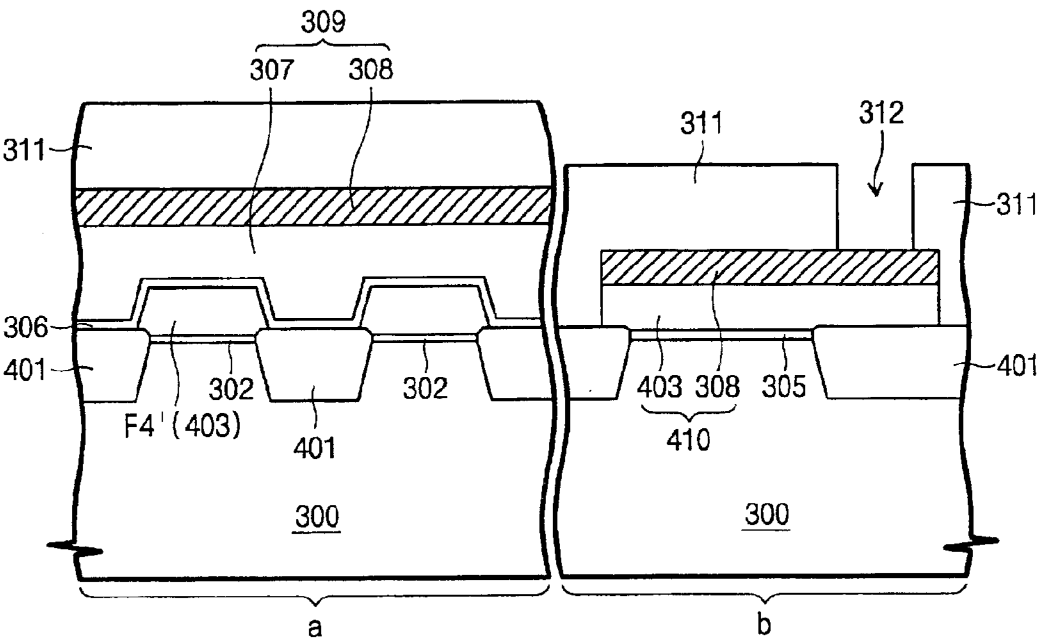
FIGS. 12A and 12B are cross sectional views for illustrating a flash memory device according to another preferred embodiment of the invention, taken along the lines I–I' and II–II' of FIG. 1, respectively.
Figure 12B:
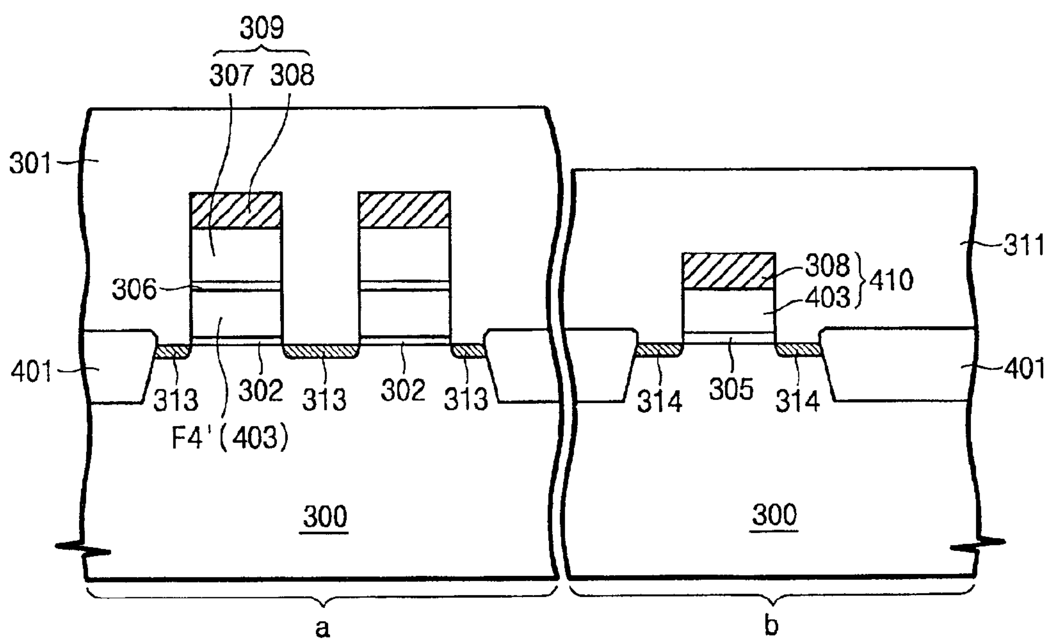

FIGS. 12A and 12B are cross sectional views for illustrating a flash memory device in accordance with another embodiment of the invention, taken along line I–I' and II–II' of FIG. 1, respectively.

Figure 8A:
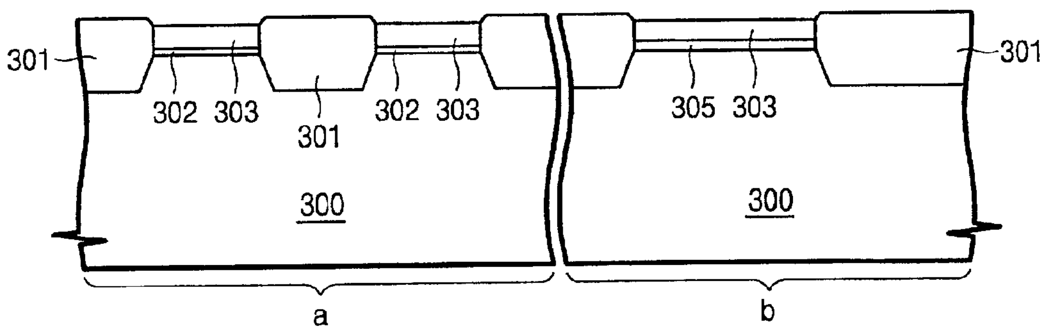
Figure 8B:
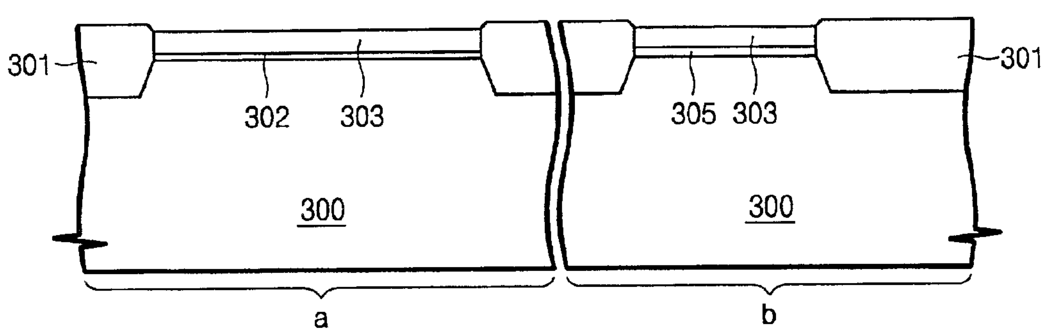

Referring to FIGS. 8A and 8B, a device isolation layer 301 is formed using a conventional self-aligned trench isolation technique at a predetermined region of a semiconductor substrate 300 having the cell array region a and the peripheral circuit region b. Thus, first active regions (20 of FIG. 1) and a second active region (30 of FIG. 1) are defined in the cell array region a and the peripheral circuit region b, respectively.

At this time, a lower conductive layer 303, which is self-aligned with the first and second active regions, is formed thereon. Also, a tunnel oxide layer 302 is interposed between the lower conductive layer 303 and the first active regions, and a gate oxide layer 305 is interposed between the lower conductive layer 303 and the second active region.

In more detail, ion implantation processes for forming a well and adjusting a threshold voltage of MOS transistors are applied to the semiconductor substrate 300. The tunnel oxide layer 302 and the gate oxide layer 305 are formed on the first active regions and the second active region, respectively. The lower conductive layer 303 and a CMP (chemical mechanical polishing) stopper layer are sequentially formed on the entire surface of the substrate including the tunnel oxide layer 302 and the gate oxide layer 305. A thickness of the gate oxide layer 305 may be different from that of the tunnel oxide layer 302, in order to optimize the potentially different electrical characteristic of peripheral transistors and cell transistors.

The lower conductive layer 303 is preferably formed of a conductive layer having a low resistivity. For example, the lower conductive layer 303 can be formed of a doped polysilicon layer. The doped polysilicon layer can be formed by depositing an undoped polysilicon layer and doping the undoped polysilicon layer with impurities such as phosphor (P) ions or arsenic (As) ions. The doping process may be performed using an ion implantation technique. Alternatively, the doping process may be performed using POC13 as a dopant material.

Subsequently, the CMP stopper layer, the lower conductive layer 303, the tunnel oxide layer 302, the gate oxide layer 305 and the semiconductor substrate 300 are sequentially patterned, thereby forming a trench region in the semiconductor substrate 300. As a result, the first active regions (20 of FIG. 1) and the second active region (30 of FIG. 1) are defined in the cell array region a and the peripheral circuit region b, respectively. An insulating layer filling the trench region is formed on the entire surface of the substrate including the trench region. The insulating layer is planarized using a CMP technique until the CMP stopper layer is exposed. Thus, a device isolation layer 301 is formed in the trench region. The exposed CMP stopper layer is then removed. As a result, the first active regions are covered with the tunnel oxide layer 302 and the lower conductive layer 303 which are self-aligned with the first active region. Similarly, the second active region is covered with the gate oxide layer 305 and the lower conductive layer 303 which are self-aligned with the second active region.

Figure 9A:
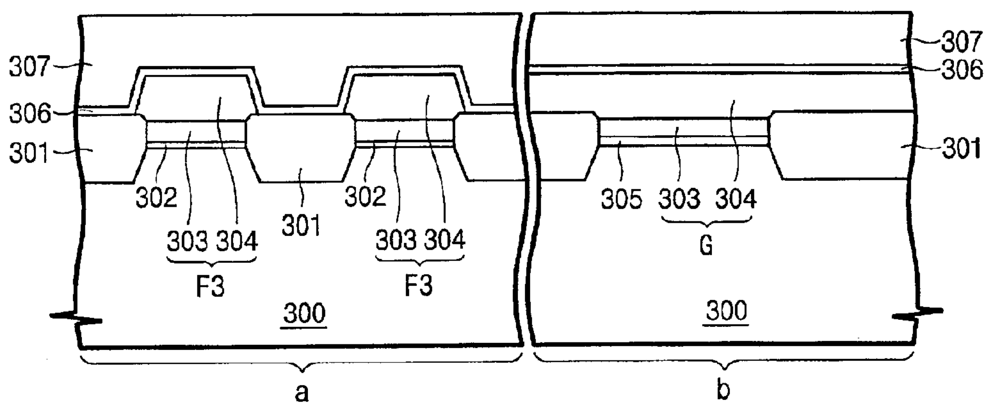
Figure 9B:
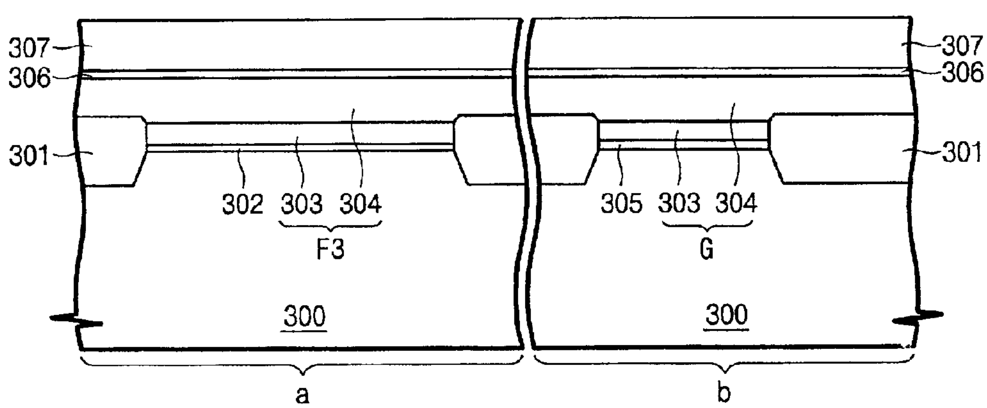

Referring to FIGS. 9A and 9B, an upper conductive layer 304 is formed on the entire surface of the semiconductor substrate where the CMP stopper layer is removed. The upper conductive layer 304 in the cell array region a is patterned to form a floating gate pattern F3. Accordingly floating gate pattern F3 is composed of the lower conductive layer 303 and the upper conductive layer 304 on the first active regions (20 of FIG. 1). The floating gate pattern F3 is formed to be overlapped with the edge of the device isolation layer 301 in the cell array region a.

During that time, the peripheral circuit region b is still covered with the upper conductive layer 304. The lower conductive layer 303 and the upper conductive layer 304 in the peripheral circuit region b constitute a gate conductive layer G.

It is preferable that the upper conductive layer 304 is formed using the same manner as the lower conductive layer 303. In other words, the upper conductive layer 304 may be formed of a low resistive layer, e.g., a doped polysilicon layer.

An inter-gate dielectric layer 306 is then formed on the entire surface of the semiconductor substrate including the floating gate pattern F3 and the gate conductive layer G. The inter-gate dielectric layer 306 is preferable formed of a dielectric layer having a high dielectric constant and a high breakdown voltage. For example, the inter-gate dielectric layer 306 may be formed of an O/N/O (oxide/nitride/oxide) layer.

It will be noted that there is no need to leave this crucial inter-gate dielectric layer 306 exposed, and thus subject to contamination. That is because the following step may happen directly afterwards.

Then a control gate conductive layer 307 is formed on the entire surface of the semiconductor substrate. The control gate conductive layer 307 can be formed of a doped polysilicon layer.

Figure 10A:
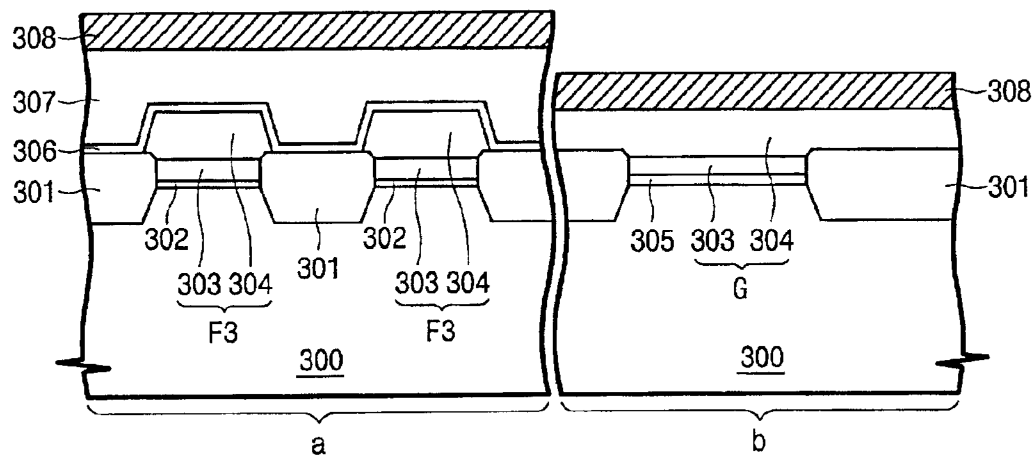
Figure 10B:
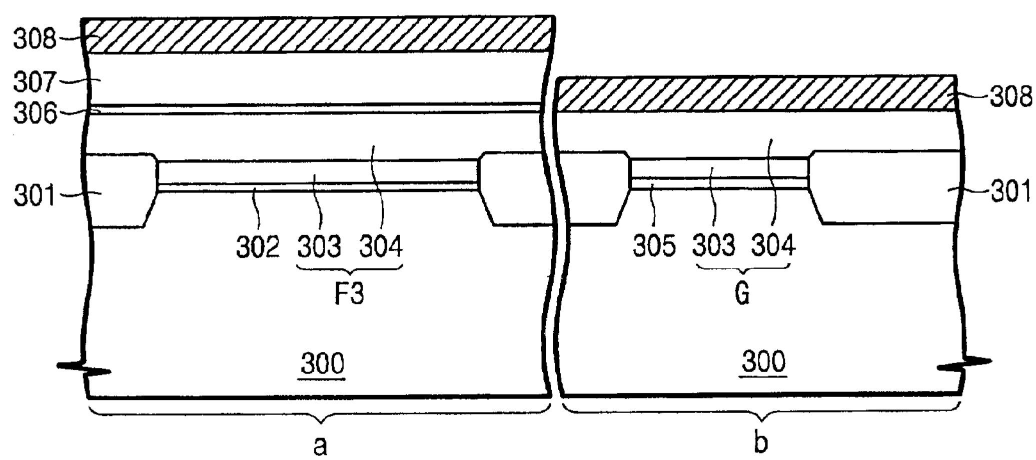

Referring to FIGS. 10A and 10B, the control gate conductive layer 307 and the intergate dielectric layer 306 in the peripheral circuit region b are selectively removed using photolithography/etching process, thereby exposing the gate conductive layer G in the peripheral circuit region b. The control gate conductive layer 307 and the gate conductive layer G are doped with impurities using an ion implantation method or a POC13doping method, thereby increasing the conductivities of the control gate conductive layer 307 and the gate conductive layer G. As a result, it is possible to reduce signal delay time (RC-delay) due to resistances of a control gate electrode and a gate electrode to be formed in a subsequent process.

A metal silicide layer 308 is then formed on the gate conductive layer G and the control gate conductive layer 307. It is preferable that the metal suicide layer 308 is formed of a material layer having a low resistivity and refractory metal, e.g., a tungsten silicide layer. The process for forming the metal silicide layer 308 can be omitted.

Figure 11A:
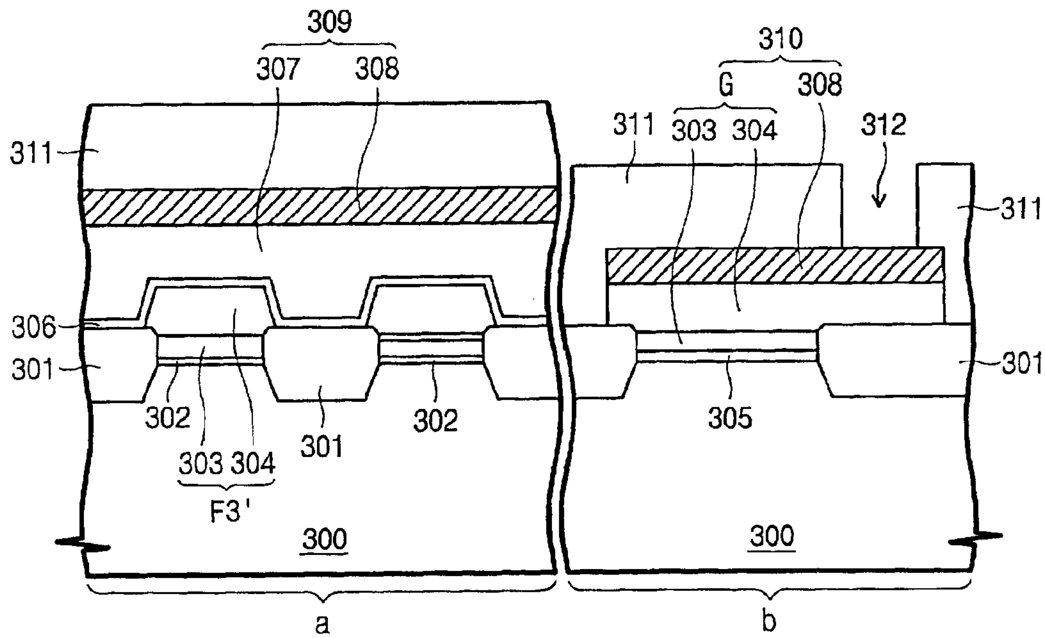
Figure 11B:
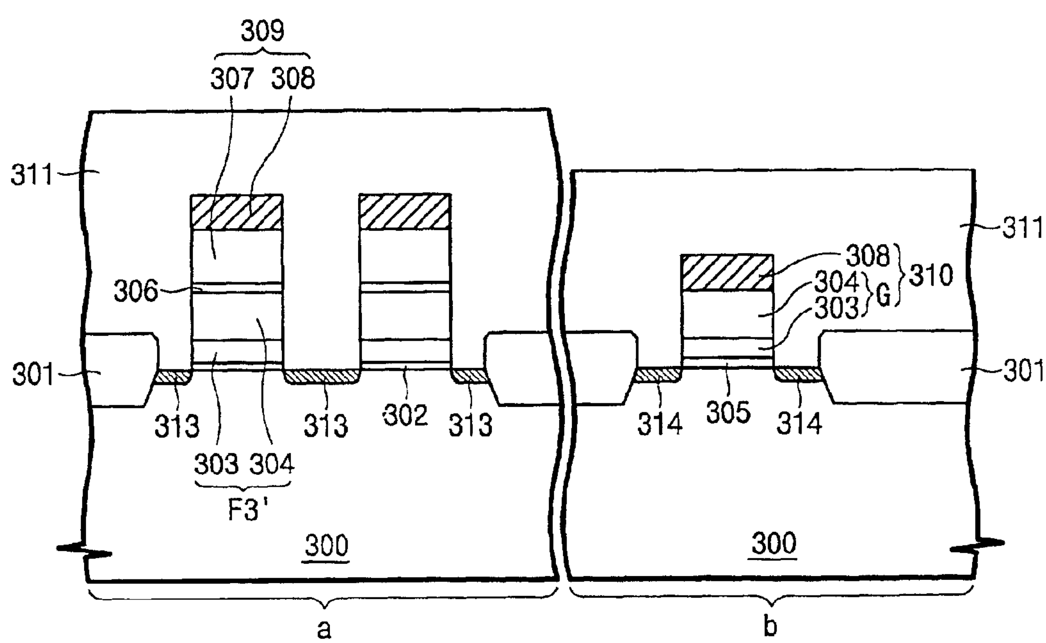

Referring to FIGS. 11A and 11B, the metal silicide layer 308, the control gate conductive layer 307, the inter-gate dielectric layer 306 and the floating gate pattern F3, which are located in the cell array region a, are successively patterned to form a plurality of control gate electrodes 309 crossing over the first active regions and floating gates F3' interposed between the control gate electrodes 309 and the first active regions. Each of the control gate electrodes 309 acts as a word line. Also, the metal silicide layer 308 and the gate conductive layer G, which are located in the peripheral circuit region b, are successively patterned to form a gate electrode 310 crossing over the second active region. In the event that the metal silicide layer 308 is not formed, the control gate electrode 309 and the gate electrode 310 do not include the metal silicide layer 308.

Subsequently, impurity ions are implanted into the semiconductor substrate 300 using the control gate electrodes 309, the gate electrode 310 and the device isolation layer 301 as ion implantation masks, thereby forming source/drain regions 313 and 314. In addition, a gate spacer (not shown) may be formed on the sidewall of the gate electrode 310 in order to form LDD-type source/drain regions in the peripheral circuit region b.

An interlayer insulating layer 311 is then formed on the entire surface of the semiconductor substrate including the source/drain regions 313 and 314. The interlayer insulating layer 311 is patterned to form a contact hole 312 exposing the gate electrode 310. At this time, other contact holes (not shown) penetrating the interlayer insulating layer 311 may be formed in the cell array region a as well as the peripheral circuit region b.

Therefore, it is possible to avoid the exposure of the inter-gate dielectric layer 306 during the fabrication process as well as simplify the fabrication process, in comparison with the conventional art.

The flash memory device according to the present invention can be fabricated by another embodiment using conventional isolation technique without a self-aligned trench process.

FIGS. 12A and 12B are cross sectional views for illustrating a flash memory device in accordance with another embodiment of the invention, taken along line I–I' and II–II' of FIG. 1, respectively.

Referring to FIGS. 12A and 12B, a device isolation layer 401 is formed at a predetermined region of the semiconductor substrate 300, thereby defining the first active regions (20 of FIG. 1) in the cell array region a and the second active region in the peripheral circuit region b. The tunnel oxide layer 302 and the gate oxide layer 305 are formed using the same manner as the first embodiment. A first conductive layer 403 is formed on the entire surface of the substrate having the tunnel oxide layer 302 and the gate oxide layer 305. The first conductive layer 403 in the cell array region a is patterned to form floating gate patterns covering the first active regions. At this time, the peripheral circuit region b is still covered with the first conductive layer 403, as described in the first embodiment.

The inter-gate dielectric layer 306 and the control gate conductive layer 307 (i.e., second conductive layer) are sequentially formed on the entire surface of the substrate having the floating gate patterns. The control gate conductive layer 307 and the inter-gate dielectric layer 306, which are located in the peripheral circuit region b, are selectively removed to expose the first conductive layer 403 in the peripheral circuit region b. The metal silicide layer 308 is formed on the control gate conductive layer 307 in the cell array region a and the first conductive layer 403 in the peripheral circuit region b.

The metal silicide layer 308, the control gate conductive layer 307, the inter-gate dielectric layer 306 and the floating gate pattern, which are located in the cell array region a, are successively patterned to form a plurality of control gate electrode 309 crossing over the first active regions and floating gates F4' interposed between the control gate electrodes 309 and the first active regions. Also, the metal silicide layer 308 and the first conductive layer 403, which are located in the peripheral circuit region b, are successively patterned to form a gate electrode 410 crossing over the second active region. Accordingly, the floating gate F4' and the gate electrode 410 do not include the lower conductive layer (303 of FIGS. 11A and 11B), unlike in the first embodiment.

Subsequently, the interlayer insulating layer 311 and the contact hole 312 are formed using the same manner as the first embodiment.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

What is claimed is:

1. A method of fabricating a flash memory device having a cell array region and a peripheral circuit region, the method comprising:

forming a device isolation layer at a predetermined region of a semiconductor substrate to define at least one first active region in the cell array region and a second active region in the peripheral circuit region;

forming a floating gate pattern covering the first active region and a gate conductive layer covering the peripheral circuit region;

forming a tunnel oxide layer having a first thickness, the tunnel oxide layer interposed between the floating gate pattern and the first active region;

forming a gate oxide layer having a second thickness, the gate oxide layer interposed between the gate conductive layer and the second active region, the second thickness different from the first thickness;

prior to formation of the tunnel oxide layer and the gate oxide layer, implanting impurity ions into the first and second active regions to adjust a threshold voltage of a MOS transistor;

prior to formation of the tunnel oxide layer and the gate oxide layer, implanting impurity ions into the first and second active regions to form a well;

sequentially forming an inter-gate dielectric layer and a control gate conductive layer on an entire surface of the substrate having the floating gate pattern and the gate conductive layer; and selectively removing the control gate conductive layer and the inter-gate dielectric layer which are located in the peripheral circuit region, thereby exposing the gate conductive layer in the peripheral circuit region.

2. The method of claim 1, in which the floating gate pattern and the gate conductive layer are formed of doped polysilicon layer.

3. The method of claim 2, in which the doped polysilicon layer is formed using an ion implantation technique.

4. The method of claim 3, in which the ion implantation technique is performed using one of phosphor ions (P) and arsenic ions (As) as dopants.

5. The method of claim 2, in which the doped polysilicon layer is formed using POC13 as a dopant source.

6. The method of claim 1, in which forming the device isolation layer, the floating gate pattern and the gate conductive layer includes:

forming a lower conductive layer on the entire surface of the semiconductor substrate;

sequentially patterning the lower conductive layer and the semiconductor to form a trench region at a predetermined region of the semiconductor substrate and concurrently define at least one first active region in the cell array region and a second active region in the peripheral circuit region;

forming a device isolation layer filling the trench region;

forming an upper conductive layer on the entire surface of the substrate having the device isolation layer; and patterning the upper conductive layer to form a floating gate pattern covering the first active region and a gate conductive layer covering the peripheral circuit region, the floating gate pattern and the gate conductive layer being composed of a portion of the lower conductive layer and a portion of the upper conductive layer.

7. The method of claim 1, further comprising:

forming a metal silicide layer on the control gate conductive layer in the cell array region and the exposed gate conductive layer in the peripheral circuit region.

8. The method of claim 7, further comprising:

patterning the metal silicide layer, the control gate conductive layer, the inter-gate dielectric layer and the floating gate pattern that arc located in the cell array region, thereby forming a word line crossing over the first active region and a floating gate interposed between the word line and the first active region; and patterning the metal silicide layer and the gate conductive layer that located in the peripheral circuit region, thereby forming a gate electrode crossing over the second active region.

9. The method of claim 1, further comprising:

patterning the control gate conductive layer, the inter-gate dielectric layer and the floating gate pattern that are located in the cell array region, thereby forming word line crossing over the first active region and a floating gate interposed between the word line and the first active region; and patterning the gate conductive layer that is located in the peripheral circuit region, thereby forming a gate electrode crossing over the second active region.

10. The method of claim 1, further comprising:

forming a metal silicide layer on the control gate conductive layer in the cell array region and the exposed gate conductive layer in the peripheral circuit region.

11. The method of claim 1, wherein forming the tunnel oxide layer and forming the gate oxide layer comprises forming the gate oxide layer to a thickness different from that of the tunnel oxide layer.

12. A method of fabricating a flash memory device having a cell array region and a peripheral circuit region, the method comprising:

forming a device isolation layer at a predetermined region of a semiconductor substrate to define at least one first active region in the cell array region and a second active region in the peripheral circuit region;

forming a floating gate pattern covering the first active region and a gate conductive layer covering the peripheral circuit region;

forming a tunnel oxide layer having a first thickness, the tunnel oxide layer interposed between the floating gate pattern and the first active region;

forming a gate oxide layer having a second thickness, the gate oxide layer interposed between the gate conductive layer and the second active region, the second thickness different from the first thickness;

prior to formation of the tunnel oxide layer and the gate layer, implanting impurity ions into the first and second active regions to adjust a threshold voltage of a MOS transistor;

prior to formation of the tunnel oxide layer and the gate oxide layer,implanting impurity ions into the first and second active regions to form a wall;

sequentially forming an inter-gate dielectric layer and a control gate conductive layer on an entire surface of the substrate having the floating gate pattern and the gate conductive layer; and stripping the control gate conductive layer and the inter-gate dielectric layer in the peripheral circuit region to expose the gate conductive layer in the peripheral circuit region.

* * * * *